July 12, 1960 R. H. MATTSON 2,945,190

TRANSISTOR CIRCUIT TEMPERATURE COMPENSATING DEVICE

Filed Aug. 22, 1956

INVENTOR
R. H. MATTSON
BY
H. O. Wright
ATTORNEY

United States Patent Office 2,945,190

Patented July 12, 1960

2,945,190

TRANSISTOR CIRCUIT TEMPERATURE COMPENSATING DEVICE

Roy H. Mattson, New Providence, N.J., assignor to Bell Telephone Laboratories, Incorporated, New York, N.Y., a corporation of New York Filed Aug. 22, 1956, Ser. No. 605,582

3 Claims. (Cl. 331—112)

Figure 1:
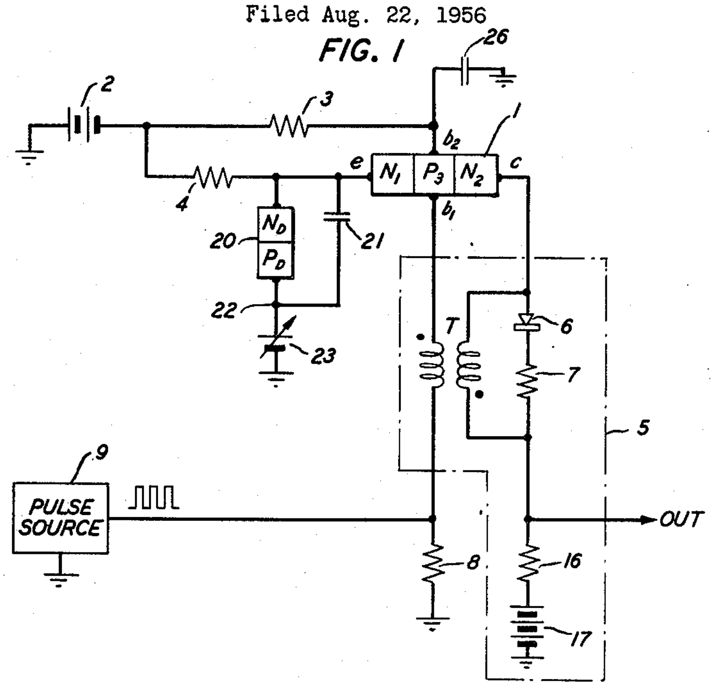

This invention relates, in general, to temperature compensating devices for circuits employing semiconductor elements. More particularly, it relates to a device for temperature stabilization of the trigger level of transistor amplifying elements.

Ever greater numbers of circuit arrangements have been and are being developed which employ semiconductor elements. Such circuit arrangements may either be virtually substitutes for long established vacuum tube circuit arrangements or they may be unconventional and directed toward accomplishing functions for which the semiconductor element and its particularly useful species, the transistor, are peculiarly well adapted.

This widespread employment of semiconductor elements has brought to the electronic arts manifold improvements which are much discussed in the literature. In some instances the electrical behavior of a semiconductor device, however, leaves something to be desired in its constancy under variable temperature conditions. This lack of temperature stability may prove a serious disadvantage for circuits wherein a semiconductor element is employed as a triggered amplifying element. Thus, a device which may be actuated by a signal of a given level at one fixed temperature may, at another temperature, be totally unresponsive to that signal.

The physical arts have long since recognized that temperature variations effect marked changes in the operability of various mechanisms. Accordingly, many stratagems and structures have been employed to circumvent the undesired effects of varying temperature. In a field of pertinence to this invention, S. Darlington et al. Patent No. 2,885,494, granted May 5, 1959; and E. R. Kretzmer, Patent No. 2,871,376, granted January 27, 1959, have disclosed devices for compensating some effects of temperature variations upon the amplifying characteristics of transistor elements.

Darlington et al. and Kretzmer direct their teachings principally toward achieving faithful reproduction of an input signal. An increasingly large proportion of electronic enterprise, however, is directed toward most advantageous employment of the discrete quantity amplifier, the pulse amplifier, essential to the proper operation of digital data processing systems. In these digital systems, certainty of response assumes a preponderance of importance over other properties of the circuit elements. This is true because the derived signal employed in such systems is a regenerated signal, i.e., a new signal which is dependent upon the amplitude of an input signal for its existence but which may be substantially unrelated to that signal in form.

A particularly useful circuit employed in such systems is the transistor blocking oscillator, one form of which is set forth in a patent to J. H. Felker No. 2,745,012, May 8, 1956. In such circuits employing transistors, the junction transistor, and particularly the four-electrode junction transistor disclosed by R. L. Wallace patent 2,695,930, June 19, 1952, is of great utility. It has been observed, however, that the trigger level at which a junction transistor blocking oscillator, or, indeed, any transistor blocking oscillator, may be driven into its regenerative blocking action, is subject to objectionably large variations with temperature variations such as are frequently encountered under normal operating conditions.

It is accordingly a principal object of this invention to render a transistor amplifying element certain in its response to an actuating signal without regard to fluctuations in the temperature at which the transistor element operates.

Other and further objects, features and advantages of the invention will become apparent during the course of the following detailed description of specific illustrative embodiments of the principles of the invention as well as from the appended claims.

Figure 2:
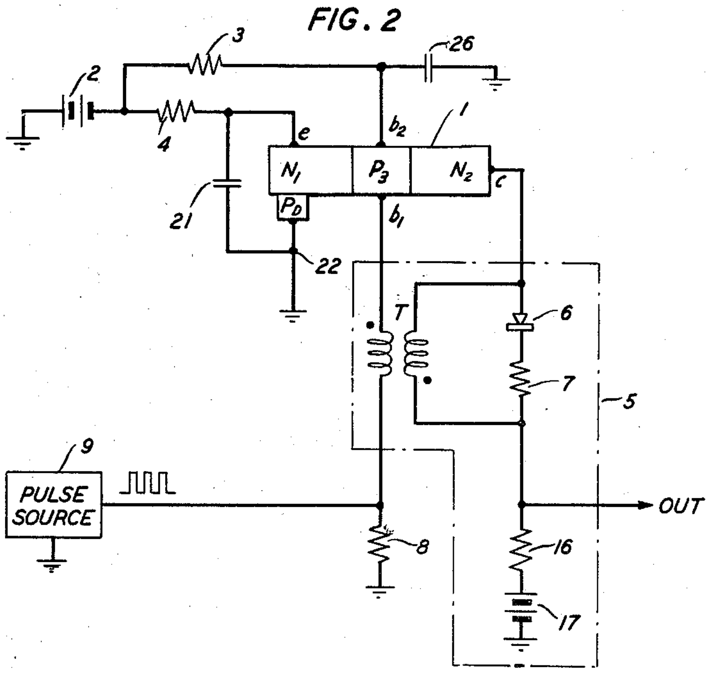

In the accompanying drawings:

Fig. 1 illustrates diagrammatically a specific illustrative blocking oscillator compensated for temperature variations in accordance with the principles of the present invention; and Fig. 2 illustrates diagrammatically a second specific illustrative blocking oscillator compensated for temperature variations in accordance with another feature of the invention.

Referring now more particularly to Fig. 1, the blocking oscillator there shown comprises a junction transistor 1, having two end zones $N_1$ and $N_2$ of n-type semiconductor material forming junctions with a third zone $P_3$ of p-type semiconductor material located centrally between the first-mentioned two zones, as shown.

Connected to the n-type zones are an emitter electrode $e$ and a collector electrode $c$, respectively, as shown. A first base electrode $b_1$ and a second base electrode $b_2$ are connected to the zone of p-type semiconductor material in accordance with the teachings of the aforementioned Wallace patent.

A battery 2 has its positive terminal connected to a point of fixed potential, here shown as ground, and its negative terminal connected both through a biasing resistor 3 to the second base electrode $b_2$ and through another biasing resistor 4 to the emitter electrode $e$.

The first base electrode $b_1$ is connected through the secondary winding of a transformer T and through a resistive impedance 8 to ground.

Thus, the battery 2 is poled to serve as a source of current in a direction to bias forwardly the emitter electrode. A by-pass capacitor 26 provides a high frequency short circuit connection to ground for the second base electrode $b_2$.

A junction diode 20 comprising a lower zone $P_D$ of p-type semiconductor material and an upper zone $N_D$ of n-type semiconductor material has its upper zone connected to the emitter electrode and its lower, p-type, zone connected to a second point of fixed potential 22 which is the positive terminal of an adjustable second battery 23. The negative terminal of this latter battery is connected to ground. A capacitor 21 shunts high frequency currents around the diode from the second point of fixed potential 22 to the emitter electrode. Thus, for low quency currents the diode is poled to provide a low resistance path for currents flowing in a direction consistent with the emitter biasing potential, that is, the diode is forwardly biased by the potential sources 2 and 23. This forwardly biased diode is employed, in accordance with the principles of the present invention, as a principal element in controlling the trigger level of the transistor.

While, in this preferred embodiment, the junction transistor is composed of particular types of semiconductor material, the batteries are poled in a fixed direction, and the junction diode is similarly fixedly poled, it is clear to those skilled in the art that the semiconductor material types may be reversed with a corresponding reversal of battery polarities.

A pulse source 9 is connected to supply trigger signals between the first base electrode $b_1$ and ground, across the resistor 8, hence between the base electrode and emitter electrode. Conventional blocking oscillator output circuitry 5, including a damping diode 6, a damping resistor 7, a positive feedback path through the transformer T, an output resistor 16 and a collector bias source 17, is connected to the collector electrode *c* for utilizing signals derived thereat.

A positive trigger pulse applied to the base electrode by the source drives the emitter electrode into a state of increased conduction. If this pulse be of suitable amplitude, and, consequently, the increase of emitter conduction be adequate, regenerative action ensues and leads to a saturation current in the output circuit 5.

The suitable amplitude required of the pulse is variable in dependence upon the ambient temperature of the transistor. This variation may be better understood by a consideration of some mathematical relations which affect current conduction across a semiconductor junction barrier. The junction barrier voltage of interest here is that voltage, $V_{EB}$, between the base electrode $b_1$ and emitter electrode *e*. Wtih certain simplifying assumptions, this voltage is given by the expression $$V_{EB}=\frac{KT}{q}\left[\ln\frac{KT}{r_e q I_{eo}}-.087(T-T_1)\right] \qquad (1)$$

where K is Boltzmann's constant, T is temperature in degrees Kelvin, $q$ is the charge of an electron, $r_e$ is emitter resistance, $I_{eo}$ is a current proportional to the saturation current of the reversely biased emitter, .087 is a numerical constant arising out of simplifying assumptions, ln is a symbol for a natural log to the base $\epsilon$, and $T_1$ is an arbitrarily chosen reference temperature of 273 degrees Kelvin.

Thus the voltage across a junction barrier is a nonlinear function of absolute temperature and involves the emitter resistance and an essentially constant reverse emitter current, as well. This emitter resistance, in turn, is an inverse function of the forwardly biased variable emitter current. The physical significance of this is simply that an emitter current increase in a forward direction is accompanied by an emitter resistance decrease. Whence, at a given temperature, some fixed emitter current brings about a critical emitter resistance and leads to a regenerative increase in the emitter current at a fixed bias voltage.

While a rigorous mathematical analysis would be very complex, it has been found experimentally, by way of specific example, that a representative value of this critical resistance which leads to the desired regenerative action may be twenty ohms and a representative emitter current $I_{eo}$ may be 0.1 microampere. Substituting these values, as well as known values of K and $q$, Equation 1 becomes even further simplified to Equation 2, viz.:

$$V_{EB}=.865\times10^{-4}T(\ln 43.2T-0.87(T-T_1)) \qquad (2)$$

To a first order of approximation, this equation has been derived from a consideration of barrier effects only. Yet, it defines with a high order of accuracy the trigger voltage necessary to actuate the junction transistor amplifying element under consideration.

The present invention is in part based upon this fact. Inasmuch as the voltage is a barrier effect, a conductive junction diode must exhibit a like temperature-voltage characteristic. Thus the invention involves recognition of the fact that a forward biased junction diode, if properly connected, may compensate for temperature variations in the trigger level given by Equation 2.

The invention also involves recognition of the fact that a trigger circuit by its very nature exhibits increased gain if, with an effectively fixed output level, the required trigger input signal be reduced in level. This reduction implies forward biasing of a semiconductor element, or, in the more familiar vacuum tube art, a more positive grid bias.

Referring to Equation 1, however, it appears that forward biasing of a transistor element might lead to an increased temperature variation effect since each of the terms in that equation is variable with temperature. Accordingly, subtracting from these variable terms a constant quantity, i.e., a fixed bias, serves only to heighten the percentage temperature effect upon the required trigger voltage. This is apparent from the following tabulation of an illustrative pair of required triggering voltages for temperatures of zero degrees and 40 degrees C., respectively, with no forward bias and with a forward bias of 0.16 volt in each case.

| Temp. °C. | $V_{EB}$ | $V_{Trigger}$(0 bias) | $V_{Trigger}$(0.15v bias) |
|---|---|---|---|
| 0° | .221 volts | .221 volts | .061 volts |
| 40° | .162 volts | .162 volts | .002 volts |

whence, in the unbiased condition, variation in trigger level with temperature change is given by $$20\log\frac{V_{0^\circ}}{V_{40^\circ}}=20\log\frac{221}{162}\simeq 2\text{ db}$$

but in the biased condition, variation in trigger level with temperature change is given by $$20\log\frac{.061}{.002}\simeq 30\text{ db}$$

Thus, the comparatively small, but still objectionable, trigger level variation with temperature of 2 db for no forward bias, is increased markedly to approximately 30 db if the transistor amplifying element be employed in a forwardly biased trigger circuit without benefit of the present invention.

In a practical application of a transistor blocking oscillator, for example, the transistor blocking oscillator of L. R. Wrathall Patent 2,703,368, March 1, 1955, Fig. 2, these experimental observations indicate that employment of a forward bias to reduce the acceptable actuating trigger signal level necessitates the acceptance of a tremendously increased temperature instability of the blocking oscillator.

In accordance with the principles of the present invention, however, a junction diode, properly poled and connected can provide the advantages of forward bias in a trigger circuit without the accompanying temperature variation disadvantages. Indeed, this proper connection of a junction diode may turn to advantage a forward bias to compensate, almost in its entirety, any voltage variation which may occur in the trigger level of a transistor semiconductor amplifying element with variations in temperature.

The invention embodies these features structurally as can be seen now, looking in more detail to Fig. 1. The potential source 2 is chosen in conjunction with the value of resistor 4 and the potential of source 23 such that current flowing through the forwardly biased junction diode 20 establishes a voltage across that diode of the exact value, as given by Equation 2, necessary to bias the transistor amplifying element 1 forwardly, but just below its regenerative threshold level. As temperature variations change this threshold, the same temperature variations also vary the biasing voltage derived from the junction diode. Accordingly, a trigger signal applied by the source 9 to the base electrode $b_1$, which may have a value at a first temperature $t_1$ just sufficient to raise the emitter voltage above its regenerative threshold level, continues to be, at a different temperature $t_2$, exactly the signal required to trigger the blocking oscillator action.

Upon triggering, the blocking oscillator experiences a marked increase in emitter current. This current attains a very high value owing to the positive feedback introduced by the transformer T. This increase leads to a strong potential at the emitter tending to bias reversely the diode 20 in opposition to the potentials applied by the sources 2 and 23.

At first glance it might appear that the forwardly biased diode is inappropriate for its blocking oscillator application. The impedances in series with the emitter-base circuit, resistors 4 and 8, as well as the emitter resistance $r_e$, are sufficient in the absence of a parallel path through the diode 20, to damp regenerative increase in the emitter current. Hence, the forwardly biased diode, intended to control the triggering of the blocking oscillator, might appear to render the oscillator inoperative, inasmuch as when the blocking action is initiated, the diode tends to become reversely biased and thus to introduce damping high resistances into the regenerating circuit.

Such is not the case, however, since, in this preferred embodiment, the trigger pulse source 9 is designed so that the trigger pulse duration is of such a value in relation to its repetition rate that minority carriers stored within the semiconductor body 20 maintain current flow in a forward direction despite the reverse bias resulting from heavy, pulsed emitter current. This phenomenon is known in the art and has been considered, for example, by J. L. Moll in The Proceedings of the Institute of Radio Engineers for December 1954, page 1778, in particular regard to transient effects in transistors.

Since the minority carrier current flow may persist after reverse biasing for a period in the order of 0.5 microsecond, the diode during this interval is held in a low resistance condition and regenerative current build-up continues. Loosely, this condition may be considered as arising from the quasi-inertial effect of carrier current flowing in a given direction within a semiconductor body. Hence, so long as the average reversed bias current does not exceed the average forward biased diode current, minority carrier storage effects permit continued operation of the blocking oscillator. Further, inasmuch as the reverse biasing of the diode is a self-curing phenomenon, i.e., the reverse current tends to interrupt the very current which begets it, the transient behavior of the semiconductor carriers, as discussed by Moll, supra, makes it possible to employ the diode in the blocking oscillator circuit in accordance with the principles of the present invention.

While in this preferred embodiment the invention has been discussed in the context of a blocking oscillator, it is readily apparent to one skilled in the art that the invention is not so limited. Indeed, in the countless trigger circuits employing junction barrier semiconductors, it may be shown that with small modifications Equation 1 describes the temperature behavior of the semiconductor element. Hence, the invention's forwardly biased diode may be employed in these circuits as well to provide temperature compensation. Indeed, the forwardly biased diode may compensate for temperature characteristic variations of semiconductor elements, be they employed in trigger circuits, or in more conventional amplifying circuits.

Too, it is clear to those skilled in the art that many variations are possible in the connections actually shown by Fig. 1. The biasing potential source 23 may, for example, be eliminated and the lower diode terminal returned directly to ground. Similarly, the invention comprehends relocation of the emitter biasing potential source 2. Indeed, only the series loop comprising the emitter-base and diode elements, the diode forward biasing means, and the necessary like polarity of diode and emitter remain constant.

Turning next to Fig. 2, there is shown a modification of the circuit of Fig. 1. Here, a tetrode junction transistor 1 having a zone $P_3$ of p-type material forming two junctions with two zones $N_1$ and $N_2$ of n-type material, has fixed integrally to one zone $N_1$ of n-type material, i.e., that zone to which the emitter electrode is connected, an additional body $P_D$ of p-type material. The adjustable biasing potential source 23 shown in Fig. 1 has been eliminated, but the remainder of the circuit of Fig. 2 is substantially identical with that of the earlier figure. Elements bearing the same designating numbers in both figures are, in general, identical and function in identical fashion.

Thus, the significant distinction between the arrangements of Figs. 1 and 2 resides in the fact that, in Fig. 2, a single body contains three p-n junctions, one for the diode and two for the transistor. Therefore, the arrangement of Fig. 2, while electrically similar to that of Fig. 1, presents the additional advantage that the electrical equivalent of the diode, i.e., the junction between the zone $N_1$ to which the emitter electrode is connected and the additional body of p-type material $P_D$ is now in most intimate contact with the transistor and can therefore more effectively compensate for temperature variations of the transistor. Thus, the integral diode of Fig. 2 provides not only an electrically simple circuit but one which provides an increased accuracy in its intended operation, i.e., the temperature compensation of the semiconductor amplifying element 1.

Numerous and varied other arangements within the spirit and scope of the principles of the present invention will readily occur to those skilled in the art. The above-described arrangements are illustrative of said principles but by no means exhaustively cover all applications of the same.

What is claimed is:

1. In combination, a junction transistor comprising a first zone and a second zone of a given conductivity type material and a third zone of opposite conductivity type material, said third zone being interposed between said first and second zones to form first and second rectifying junctions therewith, respectively, a semiconductor diode comprising a first zone of said given conductivity type material and a second zone of said opposite conductivity type material, first means for connecting said transistor first zone in common with said diode first zone, first means for biasing said first rectifying junction in a forward direction, and means for maintaining the response of said transistor to signals applied across said first rectifying junction independent of temperature variations, said maintaining means comprising second means for connecting said first biasing means in serial circuit with said transistor first zone and said transistor second zone and third means for connecting said first biasing means in serial circuit with said diode first and second zones, said third connecting means comprising second biasing means cooperatively poled with said first biasing means for biasing said diode in a forward direction.

2. The combination as set forth in claim 1 and further comprising a source of trigger pulses connected in circuit between said transistor first and third zones, the pulses from said source being poled to drive said transistor toward an increased conduction state, output circuit means connected to said transistor second zone, said output circuit means comprising positive feedback means for coupling signals from said transistor second zone to the circuit between said transistor first and third zones.

3. Apparatus as set forth in claim 2 wherein said second connecting means further comprises resistance means of a value for biasing said transistor first rectifying junction below a regenerative level.

References Cited in the file of this patent

UNITED STATES PATENTS

| | | |
|---|---|---|
| 2,657,360 | Wallace | Oct. 27, 1953 |
| 2,716,729 | Shockley | Aug. 30, 1955 |
| 2,745,012 | Felker | May 8, 1956 |
| 2,751,550 | Chase | June 19, 1956 |
| 2,757,243 | Thomas | July 31, 1956 |
| 2,758,206 | Hamilton | Aug. 7, 1956 |
| 2,802,071 | Lin | Aug. 6, 1957 |
| 2,847,583 | Lin | Aug. 12, 1958 |

OTHER REFERENCES

Publication I: Transistors Theory and Practice, Rufus P. Turner; published by Gerns Back Publication Inc., April 2, 1954, pp. 14 and 15.